(12) United States Patent
Pas

(10) Patent No.: US 6,511,777 B1
(45) Date of Patent: Jan. 28, 2003

(54) METHOD FOR MANUFACTURING A PHASE SHIFT PHOTOMASK

(75) Inventor: Sylvia D. Pas, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 16 days.

(21) Appl. No.: 09/666,933

(22) Filed: Sep. 21, 2000

Related U.S. Application Data

(60) Provisional application No. 60/163,864, filed on Nov. 5, 1999.

(51) Int. Cl.[7] .............................. G03F 9/00; C03C 15/00
(52) U.S. Cl. ............................................. 430/5; 216/62
(58) Field of Search ........................... 430/5, 322, 323, 430/30; 216/62, 87

(56) References Cited

U.S. PATENT DOCUMENTS 5,376,483 A * 12/1994 Rolfson ........................ 430/5
5,480,747 A * 1/1996 Vasudev ....................... 430/5
5,672,449 A * 9/1997 Loschner et al. .............. 430/5
6,261,725 B1 * 7/2001 Tzu et al. ...................... 430/5

* cited by examiner

Primary Examiner—S. Rosasco
(74) Attorney, Agent, or Firm—Rose Alyssa Keagy; W. James Brady, III; Frederick J. Telecky, Jr.

(57) ABSTRACT

A method for fabricating a phase shift photomask (10) includes providing a photomask (12) having a substantially opaque layer (16) on a surface (14) of a substantially transparent substrate (18). The opaque layer (14) includes a removed portion to define a light transmitting pattern (20) of the photomask (12). The method also includes depositing an implant (22) in a portion of the substrate (18). The implanted portion (24) of the substrate (18) includes an etch rate different than an etch rate of an unimplanted portion (32) of the substrate (18). The method includes initiating an etch of the substrate (18) corresponding to the light transmitting pattern (20) and monitoring a rate of the etch. The method further includes terminating the etch in response to detecting a change in the rate of the etch.

20 Claims, 1 Drawing Sheet

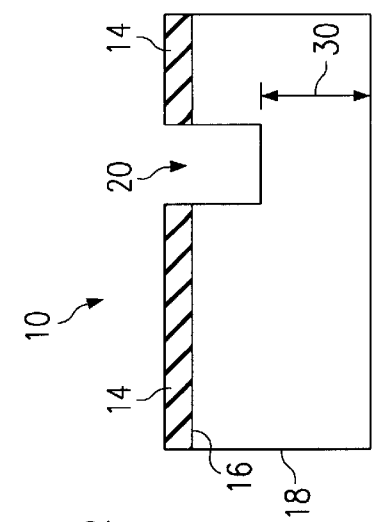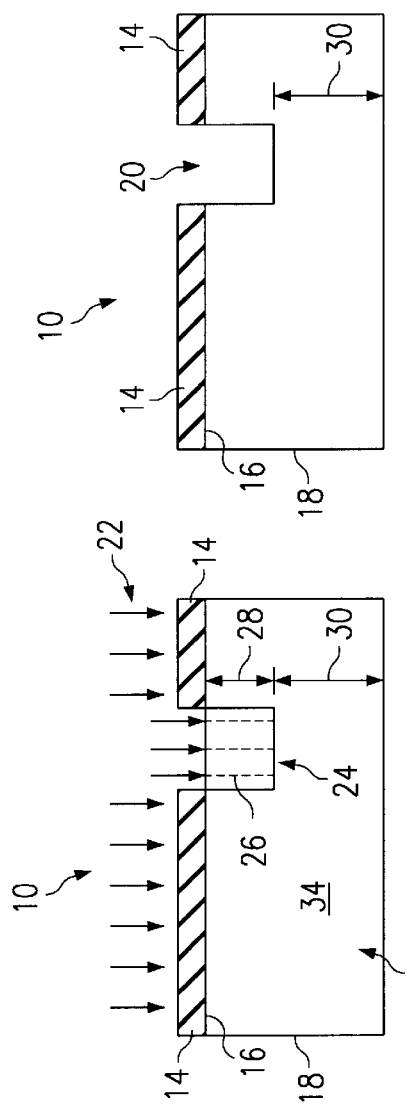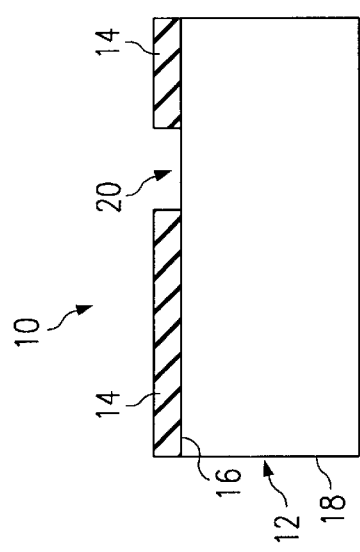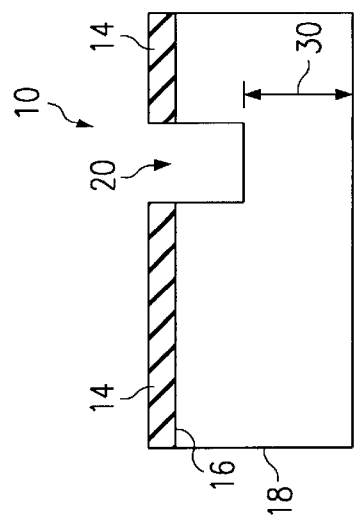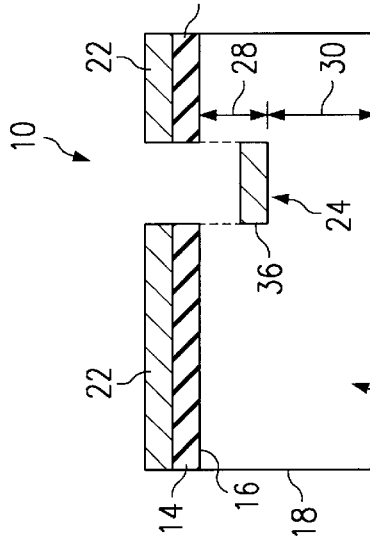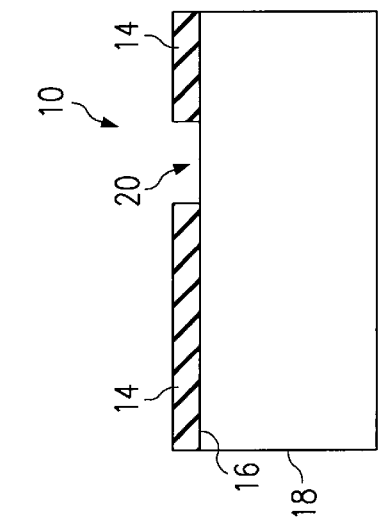

METHOD FOR MANUFACTURING A PHASE SHIFT PHOTOMASK

This application claims priority under 35 USC §119(e)(1) of provisional application No. 60/163,864 filed Nov. 5, 1999.

TECHNICAL FIELD OF THE INVENTION

This invention relates in general to the field of wafer manufacturing and, more particularly, to a method for manufacturing a phase shift photomask.

BACKGROUND OF THE INVENTION

Significant advancements in the miniaturization of semiconductor integrated circuits have been made in recent years. With such advancements, a reduction in a size of circuit patterns formed on semiconductor substrates, or wafers, has been achieved. One technique for producing a circuit pattern on a wafer includes photolithography. The photolithography technique generally includes transferring a circuit pattern from a photomask onto the wafer. The photomask is generally constructed by depositing a substantially opaque layer of material on a surface of a substantially transparent substrate. Portions of the opaque layer are then removed to form the pattern to be transferred to the wafer during a light exposure step of the photolithography process.

A photomask may also be used to provide phase shifting in the photolithography process. Phase shifting generally creates positive and negative phase light interference when administering the light exposure step in the photolithography process. Exposure light reaching an unexposed region of the wafer due to optical diffraction is generally canceled out by light reaching the exposed regions of the wafer because the light transmitted through the phase shift portion of the photomask is opposite in phase. Thus, phase shifting generally provides increased resolution of transferred patterns projected onto the wafer.

Forming a photomask for use with phase shift photolithography processing generally requires reducing a thickness of the light transmitting portion of the photomask substrate to produce a desired light phase shift. Reducing the thickness of the light transmitting portion of the photomask substrate may be accomplished by etching or other suitable processes. For example, the light transmitting portion of the photomask substrate may be chemically etched until a desired thickness of the photomask substrate is obtained to produce the desired light phase shift.

However, prior methods for manufacturing a phase shift photomask suffer several disadvantages. For example, variations in etching operations generally result in imprecise thicknesses of the light transmitting portions of the photomask substrate. For example, variations in the time, temperature, RF power, and other etch process variables are generally difficult to monitor and control. Thus, the resulting light phase shift often varies from the desired light phase shift due to a deviation between the obtained photomask substrate thickness and the desired photomask substrate thickness.

SUMMARY OF THE INVENTION

Accordingly, a need has arisen for an improved phase shift photomask that provides increased control of phase shift characteristics. The present invention provides a method for manufacturing a phase shift photomask that addresses shortcomings of prior methods.

According to one embodiment of the present invention, a method for fabricating a phase shift photomask includes providing a photomask having a substantially opaque layer on a surface of a substantially transparent substrate. The opaque layer includes a removed portion to define a light transmitting pattern of the photomask. The method also includes depositing an implant in a portion of the substrate. The implanted portion of the substrate includes an etch rate different than an etch rate of an unimplanted portion of the substrate. The method includes initiating an etch of the substrate corresponding to the light transmitting pattern and monitoring a rate of the etch. The method further includes terminating the etch in response to detecting a change in the rate of the etch.

According to another embodiment of the present invention, a method for fabricating a phase shift photomask includes providing a photomask having a substantially opaque layer on a surface of a substantially transparent substrate. The opaque layer includes a removed portion to define a light transmitting pattern of the photomask. The method also includes implanting a dopant into a portion of the substrate corresponding to the light transmitting pattern. The doped portion of the substrate includes an etch rate different than an etch rate of the undoped portion of the substrate. The method also includes initiating an etch of the substrate corresponding to the light transmitting pattern and monitoring a rate of the etch. The method further includes terminating the etch in response to detecting the etch rate of the undoped portion of the substrate The present invention provides several technical advantages. For example, the present invention provides increased control of a desired light phase shift of the photomask. For example, according to one aspect of the present invention, an implant is deposited to a predetermined depth of a portion of the substrate corresponding to a desired light phase shift. The implanted portion of the substrate has an etch rate different than an etch rate of the unimplanted portion of the substrate. An etch of the light transmitting pattern of the substrate is then initiated and monitored to detect a change in the etch rate signifying a transition of the etch from the implanted portion to the unimplanted portion of the substrate. The etch may then be terminated in response to detecting the change in the rate of the etch. Thus, the present invention provides increased control over the thickness of the substrate and the corresponding resulting light phase shift.

Other technical advantages will be readily apparent to ones skilled in the art from the following figures, descriptions, and claims.

BRIEF DESCRIPTION OF THE DRAWINGS

For a more complete understanding of the present invention and the advantages thereof, reference is now made to the following descriptions taken in connection with the accompanying drawings in which:

FIGS. 1A through 1C are diagrams illustrating a method for manufacturing a phase shift photomask in accordance with an embodiment of the present invention; and FIGS. 2A through 2C are diagrams illustrating another method for manufacturing a phase shift photomask in accordance with an embodiment of the present invention.

DETAILED DESCRIPTION OF THE INVENTION

FIGS. 1A through 1C are diagrams illustrating a method for manufacturing a phase shift photomask 10 in accordance with an embodiment of the present invention. Referring to FIG. 1A, phase shift photomask 10 is constructed from a photomask 12 having a substantially opaque layer 14 on a surface 16 of a substantially transparent substrate 18. Opaque layer 14 may include chrome or other suitable materials deposited or formed on surface 16 of substrate 18 to substantially block or prevent optical transmissions through substrate 18 during a light exposure step of a photolithography process. Substrate 18 may be constructed from glass, quartz, or other suitable optically transmissive materials having generally uniform properties. As illustrated in FIG. 1A, opaque layer 14 includes a removed portion to create a light transmitting pattern 20 corresponding to a circuit pattern to be transferred to a wafer (not explicitly shown). Light transmitting pattern 20 may be formed by etching or machining portions of opaque layer 14; however, other suitable methods may be used to create light transmitting pattern 20.

Referring to FIG. 1B, an implant 22 is deposited into substrate 18 to form an implanted portion 24 of substrate 18. Implant 22 may include a dopant such as boron, phosphorus, or other suitable dopant materials implanted into substrate 18 using conventional implantation techniques, such as ion implantation, thereby creating a doped portion 26 of substrate 18. In this embodiment, doped portion 26 extends from surface 16 of substrate 18 a predetermined depth, indicated generally by 28. Predetermined depth 28 corresponds to a desired thickness, indicated generally at 30, of substrate 18 to generate a desired light phase shift during a light exposure step of a photolithography process.

Implant 20 is selected such that an etch rate of implanted portion 24 of substrate 18 is different than an etch rate of an unimplanted portion 32 of substrate 18. For example, in the embodiment illustrated in FIG. 1B, the dopant used to form doped portion 26 of substrate 18 may be selected such that an etch rate of doped portion 26 is different than an etch rate of an undoped portion 34 of substrate 18.

Once implant 22 has been deposited into substrate 18, implanted portion 24 may be removed from substrate 18 to obtain predetermined thickness 30 of substrate 18 corresponding to light transmitting pattern 20. For example, portions of substrate 18 corresponding to light transmitting pattern 20 may be etched using a wet or dry etch technique to remove doped portion 26. Additionally, once the etch of substrate 18 has been initiated, a rate of the etch may be monitored to detect changes in the rate of the etch, thereby signifying a transition of the etch from implanted portion 24 to unimplanted portion 32.

Referring to FIG. 1C, as the etch transitions from implanted portion 24 to unimplanted portion 32 of substrate 18, detecting a change in the rate of the etch generally indicates that the etch has reached predetermined depth 28. For example, in the embodiment illustrated in FIG. 1B, the dopant used to form doped portion 26 may be selected such that doped portion 26 includes an etch rate faster or greater than an etch rate of undoped portion 34. Thus, as the etch transitions from doped portion 26 to undoped portion 34, a decrease in the rate of the etch may be detected, thereby indicating that the etch has reached predetermined thickness 28 of substrate 18. Thus, in response to detecting a change in the rate of the etch, the etch may be terminated, thereby providing thickness 30 of substrate 18 substantially corresponding to a desired thickness to achieve a desired light phase shift. Thus, the present invention provides greater light phase shift accuracy than prior systems and methods by increasing the control of thickness 30 of substrate 18 corresponding to light transmitting pattern 20.

FIGS. 2A through 2C are diagrams illustrating another method for manufacturing phase shift photomask 10 in accordance with an embodiment of the present invention. Referring to FIG. 2A, phase shift photomask 10 includes opaque layer 14 on surface 16 of substrate 18. As described above, a portion of opaque layer 14 may be removed to produce light transmitting pattern 20 corresponding with a circuit pattern to be transferred to a wafer during a photolithography process.

Referring to FIG. 1B, implant 22 is deposited within substrate 18 at predetermined depth 28 measured from surface 16 of substrate 18. In this embodiment, implant 22 comprises an interlayer 36 implanted into substrate 18 to form implanted portion 24. Interlayer 36 may comprise implanted nitrogen, silicon, carbon, germanium, or other suitable dopant or nondopant materials such that the etch rate of implanted portion 24 is different than the etch rate of unimplanted portion 32 of substrate 18. In the embodiment illustrated in FIG. 2B, interlayer 36 is deposited within substrate 18 corresponding to light transmitting pattern 20. However, interlayer 36 may also extend beyond portion of substrate 18 corresponding to light transmitting pattern 20. As described above, predetermined depth 28 corresponds to thickness 30 of substrate 18 generally required to obtain a desired light phase shift during a light exposure step of a photolithography process.

Referring to FIG. 1C, implanted portion 24 may be removed from substrate 18 to provide thickness 30 of substrate 18 corresponding to light transmitting pattern 20. For example, an etch of substrate 18 corresponding to light transmitting pattern 20 may be initiated to remove implanted portion 24 and a portion of unimplanted portion 32 disposed between surface 16 and implanted portion 24. In operation, interlayer 36 may be selected such that the etch rate of implanted portion 24 is different than the etch of unimplanted portion 32. Thus, once the etch is initiated, a rate of the etch may be monitored to detect changes in the rate of the etch corresponding to transitions of the etch through substrate 18.

For example, interlayer 36 may be selected such that the etch rate of implanted portion 24 is faster or greater than the etch rate of unimplanted portion 32. Once the etch has been initiated, the rate of the etch may be monitored to detect changes in the rate of the etch. For example, initially, the etch rate of unimplanted portion 32 disposed between surface 16 and implanted portion 24 may be detected, generally indicating that the etch is within the portion of unimplanted portion 32 between surface 16 and implanted portion 24. Detecting an increase in the rate of the etch generally indicates a transition of the etch from unimplanted portion 32 to implanted portion 24. As the etch continues, detecting a decrease in the rate of the etch generally indicates a transition of the etch from implanted portion 24 to unimplanted portion 32 disposed beneath implanted portion 24.

Thus, in response to detecting a change in the rate of the etch after detecting the etch rate corresponding to implanted portion 24, the etch may be terminated, thereby resulting in thickness 30 of substrate 18 corresponding to light transmitting pattern 20. Thus, the present invention provides increased control of thickness 30 of substrate 18 corresponding to a desired light phase shift of a photolithography process.

Although the present invention and its advantages have been described in detail, it should be understood that various changes, substitutions, and alterations can be made therein without departing from the spirit and scope of the present invention as defined by the appended claims.

What is claimed is:

1. A method for fabricating a phase shift photo mask, comprising:

providing a photomask having a substantially opaque layer on a surface of a substantially transparent substrate, the opaque layer having a removed portion to define a light transmitting pattern of the photomask;

depositing an implant in a portion of the substrate, the implanted portion of the substrate having an etch rate different than an etch rate of an unimplanted portion of the substrate;

initiating an etch of the substrate corresponding to the light transmitting pattern;

monitoring a rate of the etch; and terminating the etch in response to detecting a change in the rate of the etch.

2. The method of claim 1, wherein depositing the implant comprises implanting a dopant to a predetermined depth of the substrate from the surface of the substrate.

3. The method of claim 2, wherein terminating the etch comprises terminating the etch in response to detecting the etch rate of the unimplanted portion of the substrate.

4. The method of claim 1, wherein depositing the implant comprises implanting an interlayer at a predetermined depth of the substrate from the surface of the substrate.

5. The method of claim 4, further comprising:

monitoring the etch to detect the etch rate of the unimplanted portion of the substrate;

monitoring the rate of the etch to detect an etch rate of the interlayer; and wherein terminating the etch comprises terminating the etch in response to detecting the etch rate of the unimplanted portion of the substrate after detecting the etch rate of the interlayer.

6. The method of claim 1, wherein depositing the implant comprises:

implanting a dopant to a predetermined depth of the substrate from the surface of the substrate, wherein the etch rate of the implanted portion of the substrate is greater than the etch rate of the unimplanted portion of the substrate; and wherein terminating the etch comprises terminating the etch in response to detecting an etch rate less than the etch rate of the implanted portion of the substrate.

7. The method of claim 1, wherein depositing the implant comprises implanting an interlayer in the substrate, the interlayer disposed a predetermined distance from the surface of the substrate, the interlayer having a substantially uniform thickness, and wherein terminating the etch comprises terminating the etch in response to detecting a change in the rate of the etch corresponding to the etch rate of the unimplanted portion of the substrate after detecting an etch rate of the interlayer.

8. A method for fabricating a phase shift photomask, comprising:

providing a photomask having a substantially opaque layer on a surface of a substantially transparent substrate, the opaque layer having a removed portion to define a light transmitting pattern of the photomask;

implanting a dopant into a portion of the substrate corresponding to the light transmitting pattern, the doped portion of the substrate having an etch rate different than an etch rate of the undoped portion of the substrate;

initiating an etch of the substrate corresponding to the light transmitting pattern;

monitoring a rate of the etch; and terminating the etch in response to detecting the etch rate of the undoped portion of the substrate.

9. The method of claim 8, wherein implanting the dopant comprises implanting the dopant to a predetermined depth of the substrate, the predetermined depth corresponding to a desired light phase shift.

10. The method of claim 8, wherein the etch rate of the doped portion of the substrate is greater than the etch rate of the undoped portion of the substrate, and wherein terminating the etch comprises terminating the etch in response to detecting an etch rate less than the etch rate of the doped portion.

11. The method of claim 8, wherein implanting the dopant comprises implanting the dopant to a substantially uniform depth of the substrate, the depth corresponding to a desired light phase shift.

12. The method of claim 8, wherein the etch comprises a wet etch.

13. The method of claim 8, wherein monitoring the rate of the etch comprises:

detecting the etch rate of the doped portion of the substrate; and detecting the etch rate of the undoped portion of the substrate after detecting the etch rate of the doped portion.

14. A method for fabricating a phase shift photomask, comprising:

providing a photomask having a substantially opaque layer on a surface of a substantially transparent substrate, the opaque layer having a removed portion to define a light transmitting pattern of the photomask;

implanting an interlayer in a portion of the substrate, the implanted portion of the substrate having an etch rate different than an etch rate of an unimplanted portion of the substrate;

initiating an etch of the substrate corresponding to the light transmitting pattern;

monitoring a rate of the etch;

detecting the etch rate of the implanted portion of the substrate; and terminating the etch in response to detecting the etch rate of the unimplanted portion of the substrate after detecting the etch rate of the implanted portion.

15. The method of claim 14, wherein implanting the interlayer comprises implanting the interlayer at a predetermined depth of the substrate, the predetermined depth corresponding to a desired light phase shift.

16. The method of claim 14, wherein implanting the interlayer comprises implanting the interlayer in the substrate, the interlayer having a substantially uniform thickness.

17. The method of claim 14, wherein the etch rate of the implanted portion of the substrate is greater than the etch rate of the unimplanted portion of the substrate, and wherein terminating the etch comprises terminating the etch in response to detecting an etch rate less than the etch rate of the implanted portion.

18. The method of claim 14, wherein implanting the interlayer comprises implanting the interlayer in the portion of the substrate corresponding to the light transmitting pattern.

19. The method of claim 14, wherein initiating the etch comprises initiating a dry etch.

20. The method of claim 14, wherein monitoring the rate of the etch further comprises detecting the etch rate of the unimplanted portion of the substrate prior to detecting the etch rate of the implanted portion of the substrate.

* * * * *